(12) United States Patent
Fang et al.

(10) Patent No.: US 6,436,778 B1
(45) Date of Patent: Aug. 20, 2002

(54) RE-OXIDATION APPROACH TO IMPROVE PERIPHERAL GATE OXIDE INTEGRITY IN A TUNNEL NITRIDE OXIDATION PROCESS

(75) Inventors: Hao Fang, Cupertino; Yue-song He, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/879,738

(22) Filed: Jun. 12, 2001

(51) Int. Cl.[7] .................................. H01L 21/336
(52) U.S. Cl. ................. 438/305; 438/259; 438/263; 438/269
(58) Field of Search ............... 438/693, 692, 438/275, 769, 776, 264, 263, 257, 768, 259, 305

(56) References Cited

U.S. PATENT DOCUMENTS

| | | | | |
|---|---|---|---|---|
| 5,661,055 A | * | 8/1997 | Hsu et al. ............... | 438/259 |
| 5,861,347 A | * | 1/1999 | Maiti et al. ......... | 148/DIG. 117 |
| 6,117,783 A | * | 9/2000 | Samll et al. ............ | 438/693 |
| 6,143,608 A | * | 11/2000 | He et al. ............... | 438/264 |
| 6,147,002 A | * | 11/2000 | Kneer ................... | 134/3 |
| 6,153,935 A | * | 11/2000 | Edelstein et al. ........ | 257/276 |
| 6,177,312 B1 | * | 1/2001 | He et al. ............... | 438/257 |
| 6,225,167 B1 | * | 5/2001 | Yu et al. ............... | 438/275 |
| 6,306,707 B1 | * | 10/2001 | Foster et al. ........... | 438/263 |

* cited by examiner

Primary Examiner—Michael S. Lebentritt
(74) Attorney, Agent, or Firm—Amin & Turocy, LLP

(57) ABSTRACT

A process for fabricating a semiconductor device 20 that includes providing semiconductor substrate 28 having a core region 24 and a peripheral gate region 26. The semiconductor substrate 28 has at least one shallow trench isolation region 30 and at least one nitrogen-contaminated region 36 in the peripheral gate region 26. A tunnel oxide layer 34 overlies the semiconductor substrate 28 and a first polysilicon layer 38 overlies the tunnel oxide layer 34 in the core region 24. An ONO layer 40 overlies the first polysilicon layer 38 in the core region 24. The process further includes growing a sacrificial oxide layer 42 overlying the nitrogen-contaminated region 36 in the peripheral gate region 26, wherein oxygen from within the sacrificial oxide layer 42 diffuses into the nitrogen-contaminated region 36 and forms silicon dioxide. By allowing oxygen from within the sacrificial oxide layer 42 to diffuse into the nitrogen-contaminated region 36 and form silicon dioxide, the nitrogen 56 can be removed from within the semiconductor substrate 28 by removing the silicon dioxide.

17 Claims, 3 Drawing Sheets

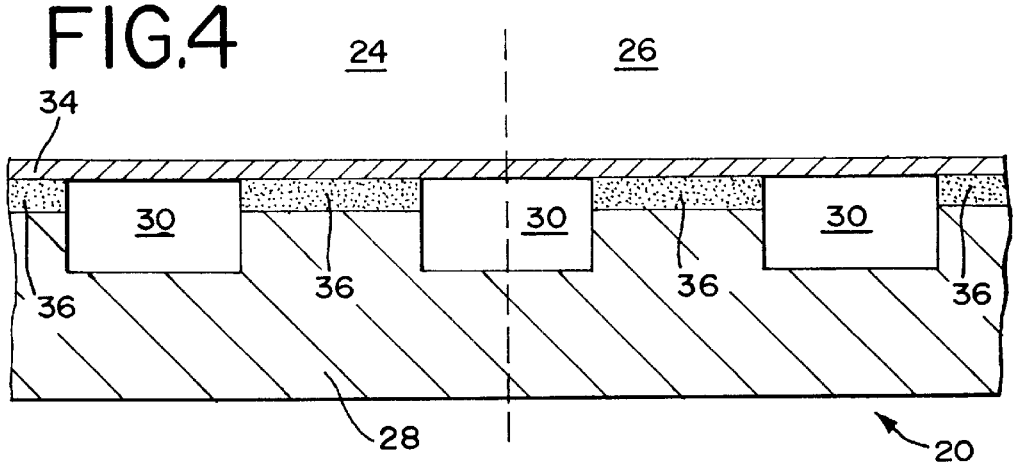
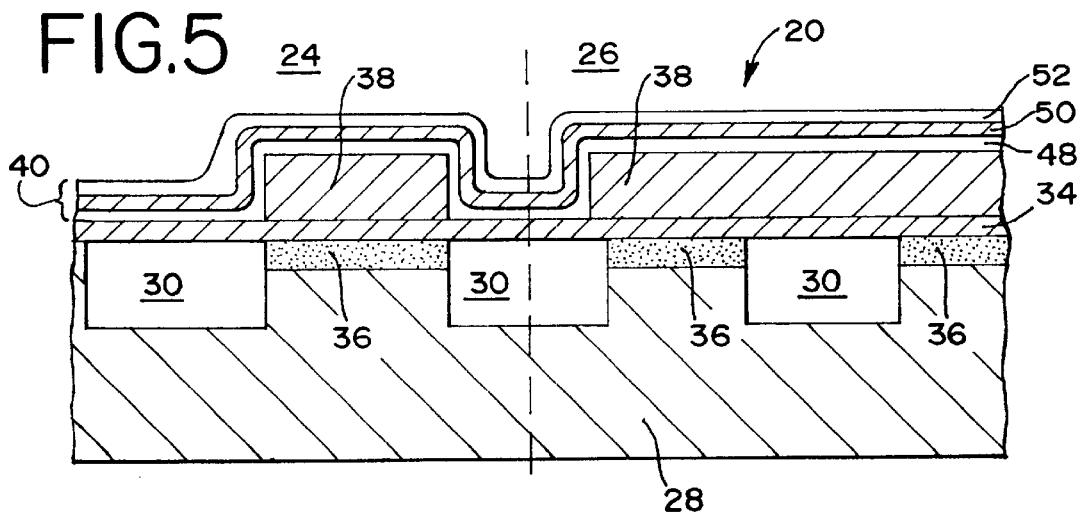
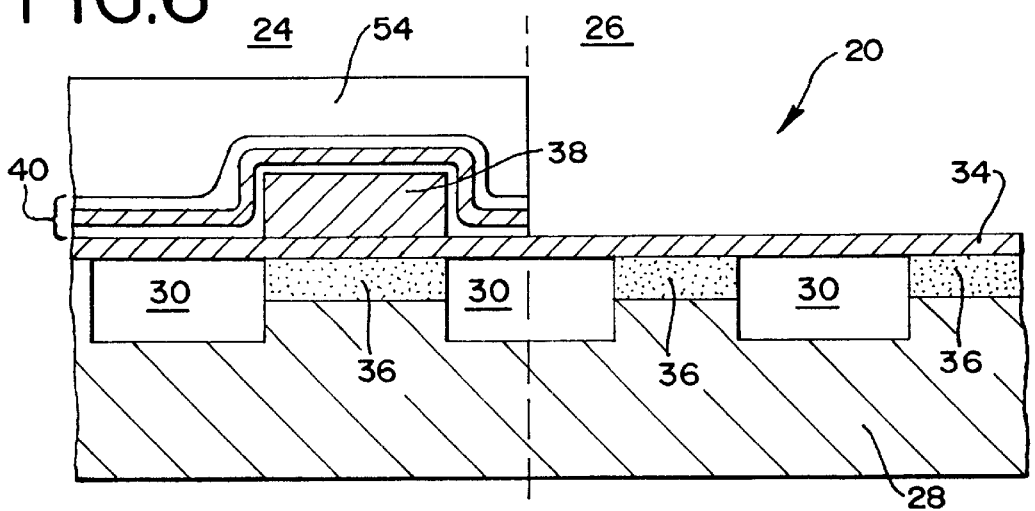

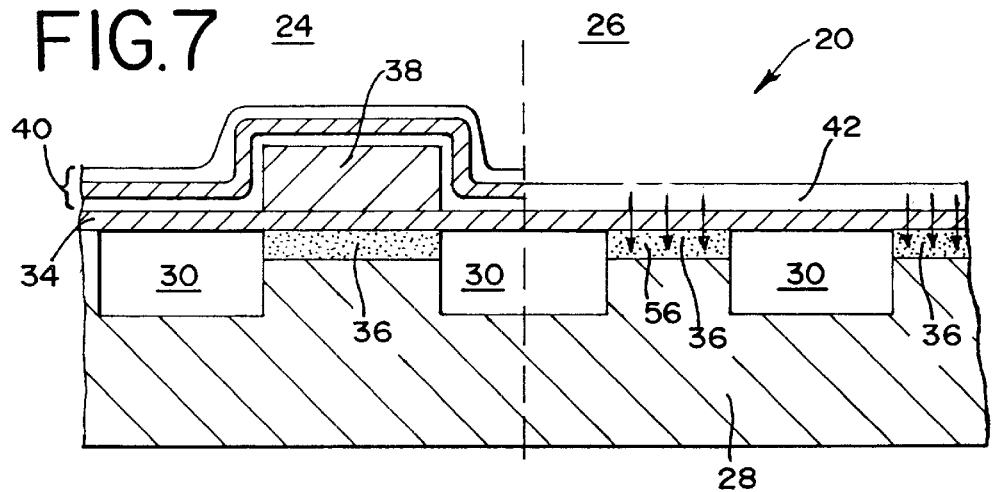
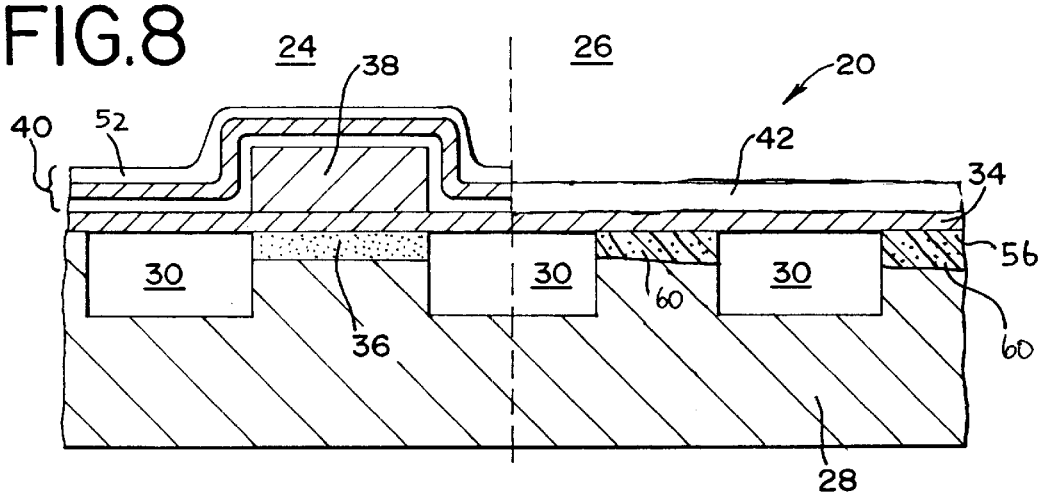
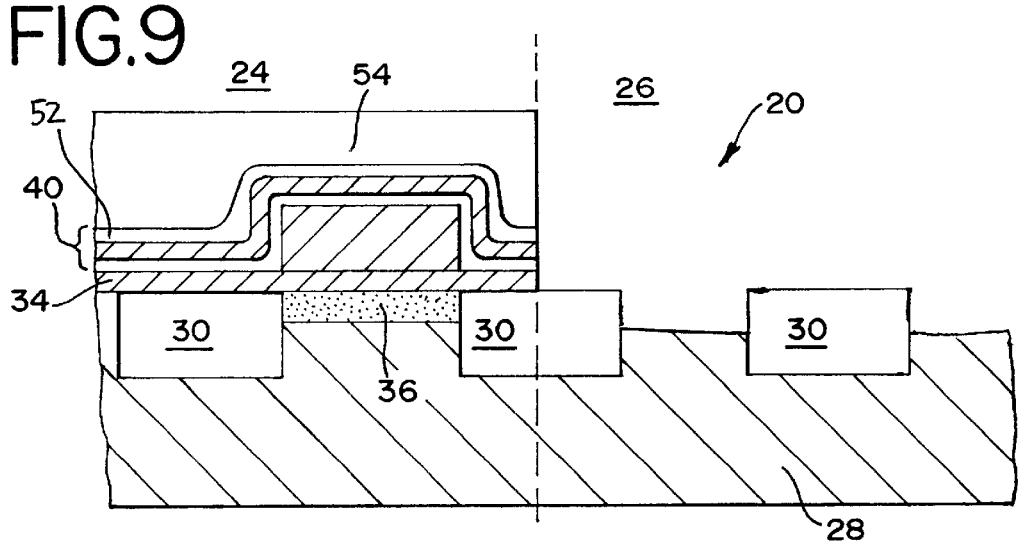

RE-OXIDATION APPROACH TO IMPROVE PERIPHERAL GATE OXIDE INTEGRITY IN A TUNNEL NITRIDE OXIDATION PROCESS

FIELD OF THE INVENTION

This invention relates generally to semiconductor device. In particular, the present invention relates to a method and process for manufacturing a non-volatile memory device.

BACKGROUND OF THE INVENTION

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, Flash EEPROM devices enable the erasing of large blocks of memory cells in the device using a single electrical current pulse.

Typically, an EEPROM device includes a floating-gate electrode within which electrical charge is stored. The floating-gate electrode overlies a channel region residing between source and drain regions in a semiconductor substrate. The floating-gate electrode together with the source and drain regions forms an enhancement transistor. By storing negative electrical charge on the floating-gate electrode, the threshold voltage of the enhancement transistor is brought to a relatively high value. Correspondingly, when negative charge is removed from the floating-gate electrode, the threshold voltage of the enhancement transistor is brought to a relatively low value. The threshold level of the enhancement transistor determines the current flow through the transistor when the transistor is turned on by the application of appropriate voltages to the gate and drain. When the threshold voltage is high, no current will flow through the transistor, which is defined as a logic 0 state. Correspondingly, when the threshold voltage is low, current will flow through the transistor, which is defined as a logic 1 state. Data resides in a certain logic state on the floating-gate electrode. During a read operation, selected data from a selected floating-gate electrode can be output to an external communication unit using a bit-line.

In a flash EEPROM device, electrons are transferred to a floating-gate electrode through a dielectric layer overlying the channel region of the enhancement transistor. The electron transfer is initiated by either hot electron injection, or by Fowler-Nordheim tunneling. In either electron transfer mechanism, a voltage potential is applied to the floating-gate by an overlying control-gate electrode. The control-gate electrode is capacitively coupled to the floating-gate electrode, such that a voltage applied on the control-gate electrode is coupled to the floating-gate electrode. The flash EEPROM device is programmed by applying a high positive voltage to the control-gate electrode, and a lower positive voltage to the drain region, which transfers electrons from the channel region to the floating-gate electrode. The flash EEPROM device is erased by grounding the control-gate electrode and applying a high positive voltage through either the source or drain region of the enhancement transistor. Under erase voltage conditions, electrons are removed from the floating-gate electrode and transferred into either the source or drain regions in the semiconductor substrate.

Product development efforts in EEPROM device technology have focused on increasing the programming speed, lowering programming and reading voltages, increasing data retention time, reducing cell erasure times and reducing cell dimensions. Many of the foregoing research goals can be addressed through development of materials and processes for the fabrication of the floating-gate electrode. While the recent advances in EEPROM technology have enabled memory designers to double the memory capacity of EEPROM arrays using two-bit data storage, numerous challenges exist in the fabrication of material layers within these devices. In particular, fabricating a tunnel oxide within a memory cell presents several challenges. For example, the reliability of the tunnel oxide can be problematic. The problems with the reliability of the tunnel oxide are often associated with charge trapping and oxide damage during the programming and erasing cycles within the memory cell. The damaged tunnel oxide may cause memory data retention problems and may also result in the failure of the memory cell. In order to improve the reliability of the tunnel oxide, an oxynitridation process is often employed to form the tunnel oxide.

There are several problems that occur with the above-described method for fabricating a memory cell. One problem is that during the oxynitridation process, nitrogen, which is introduced into the tunnel oxide, can also enter into and contaminate the gate oxide in the peripheral gate region. Nitrogen introduced into the semiconductor substrate will often form a bond with the silicon atoms in the semiconductor substrate, and thus, make it very difficult to remove the nitrogen from the semiconductor substrate. For example, the nitrogen that is contaminating the semiconductor substrate cannot be effectively removed by using a conventional hydrofluoric acid etch process. Additionally, the presence of the contaminate nitrogen contributes to non-uniform oxide growth during a subsequent growth of a gate oxide layer. Since the oxynitridation process degrades the characteristics of the gate oxide layer in a peripheral gate region of the memory cell, the oxynitridation approach is less attractive for manufacturing memory cells. Accordingly, advances in memory cell fabrication technology are necessary to improve the reliability of the tunnel oxide without affecting the reliability of the gate oxide layer.

BRIEF SUMMARY

The present invention is for a process for fabricating a semiconductor device, and more preferably, a memory device. Although the following description is described with respect to fabricating an EEPROM device, it will be recognized by those skilled in the art that the following description can not only be applied to fabricating any non-volatile memory device, such as a one-bit or two-bit EEPROM device, but to any semiconductor device as well, such as a capacitor, a diode, a resistor, an amplifier, a memory chip, a microchip, an integrated circuit, a transistor, a digital signal processor, and a logic chip.

According to one aspect of the present invention, a process for fabricating a semiconductor device is provided. The process includes providing a semiconductor substrate having a core region and a peripheral gate region. The semiconductor substrate has at least one shallow trench isolation region and at least one nitrogen-contaminated region in the peripheral gate region. A tunnel oxide layer overlies the semiconductor substrate and a first polysilicon layer overlies the tunnel oxide layer in the core region. An ONO layer overlies the first polysilicon layer in the core region. The process further includes growing a sacrificial oxide layer overlying the nitrogen-contaminated region in the peripheral gate region, wherein oxygen from within the sacrificial oxide layer diffuses into the nitrogen-contaminated region and forms silicon dioxide. By allowing oxygen from within the sacrificial oxide layer to diffuse into the nitrogen-contaminated region and form silicon dioxide, the nitrogen can be removed from within the semiconductor substrate by removing the silicon dioxide.

BRIEF DESCRIPTION OF THE DRAWINGS

FIGS. 2–9 illustrate, in cross-section, process steps for the fabrication of a semiconductor device containing a tunnel oxide layer, in accordance with one preferred embodiment of the invention.

Figure 1:
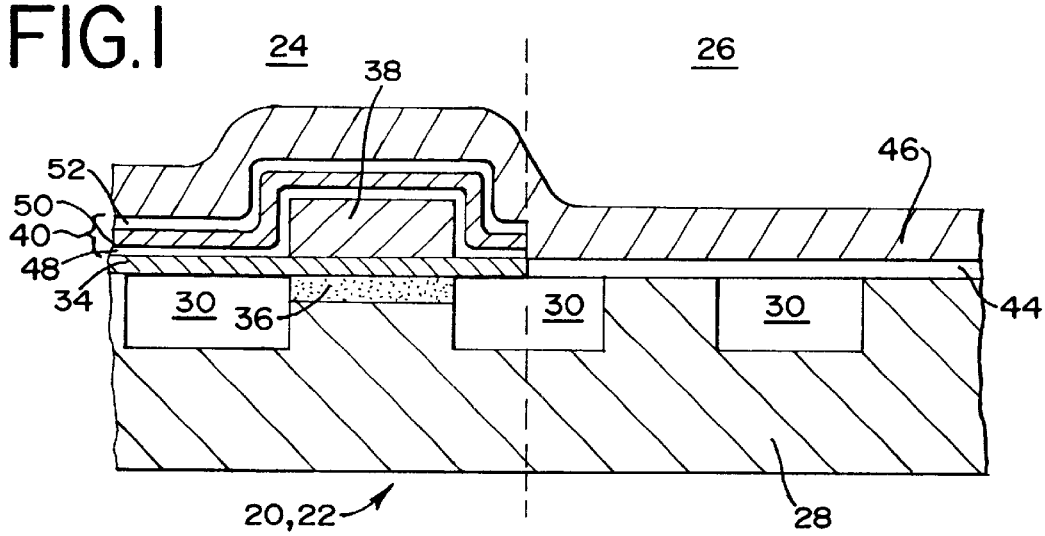
FIG. 1 illustrates, in cross-section, a portion of a semiconductor device containing a tunnel oxide layer, in accordance with one preferred embodiment of the invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF PRESENTLY PREFERRED EMBODIMENTS

Shown in FIG. 1, in cross-section, is a semiconductor device 20, and in particular, a memory device 22. The semiconductor device 20 includes any semiconductor device known to those skilled in the art, such as a capacitor, a diode, a resistor, an amplifier, a memory chip, a microchip, an integrated circuit, a transistor, a digital signal processor, and a logic chip. Memory device 22 includes any memory device known by those skilled in the art, such as a RAM device, a DRAM device, an SDRAM device, a ROM device, an NROM device, and PROM device, an EEPROM device such as a one-bit or two-bit EEPROM device, and any non-volatile memory device known to those skilled in the art. Please note that FIGS. 1–9 illustrate only a portion of the memory device 22 and that memory device 22 may include many memory cells within memory device 22. For the sake of clarity, these additional memory cells have been left out of FIGS. 1–9.

Memory device 22 includes a semiconductor substrate 28 having a core region 24 that is located towards the center of the memory device 22 and a peripheral gate region 26 that is located at the periphery of the memory device 22, as illustrated in FIG. 1. Semiconductor substrate 28 has at least one shallow trench isolation (STI) region 30 in the semiconductor substrate 28. Preferably, semiconductor substrate 28 has at least one STI region 30 in the core region 24 of semiconductor substrate 28 and at least one STI region 30 in the peripheral gate region 26 of semiconductor substrate 28, as illustrated in FIG. 1. Additionally, semiconductor substrate has at least one nitrogen-contaminated region 36 in the peripheral gate region 26 of the semiconductor substrate 28. Preferably, nitrogen-contaminated region 36 is located between two STI regions 30, as illustrated in FIG. 1. Memory device also includes a tunnel oxide layer 34, a first polysilicon layer 38, an oxide-nitride-oxide (ONO) layer 40, a gate oxide layer 44, and a second polysilicon layer 46. Tunnel oxide layer 34 overlies the semiconductor substrate 28 in the core region 24. The first polysilicon layer 38 overlies the tunnel oxide layer 34 in the core region 24, and ONO layer 40 overlies the first polysilicon layer 38 in the core region. ONO layer 40 includes a first oxide layer 48 overlying the first polysilicon layer 38, a nitride layer 50 overlying the first oxide layer 48, and a second oxide layer 52 overlying the nitride layer 50, as illustrated in FIG. 1. The gate oxide layer 44 overlies the semiconductor substrate 28 in the peripheral gate region 26. The second polysilicon layer 46 overlies the semiconductor substrate in the core region 24 and the peripheral gate region 26.

Figure 2:
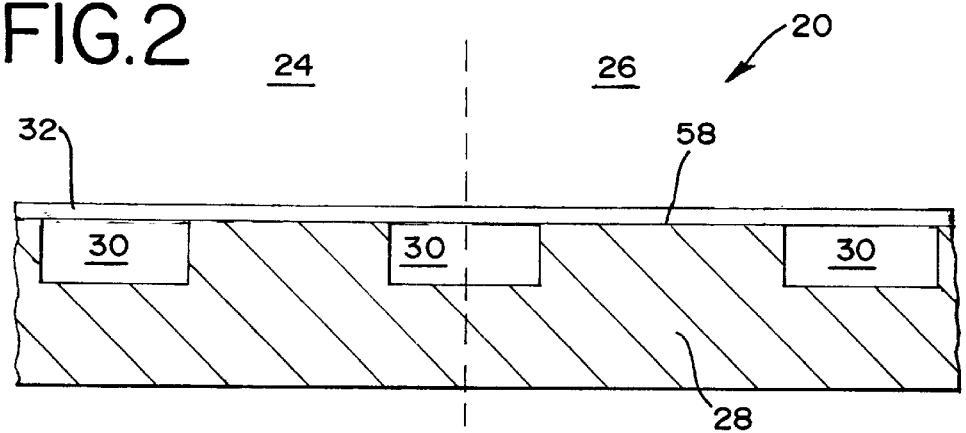

Referring to FIGS. 2–9, process steps for the fabrication of a semiconductor device 20 containing a tunnel oxide layer 34, such as a memory device 22, are illustrated in accordance with one preferred embodiment. As illustrated in FIG. 2, at least one STI region 30 is formed within semiconductor substrate 28. Semiconductor substrate 28 includes any semiconductor material conventionally known to those of ordinary skill in the art, such as silicon, gallium arsenide, germanium, gallium nitride, aluminum phosphide, alloys such as $Si_{1-x}Ge_x$ and $Al_xGa_{1-x}As$, where $0 \leq x \leq 1$, and any other known semiconductor material such as those listed in Semiconductor Device Fundamentals, on page 4, Table 1.1 (Robert F. Pierret, Addison-Wesley, 1996). Preferably, the semiconductor substrate 28 is silicon, which may be doped or undoped. More preferably, semiconductor substrate 28 is a single crystal silicon substrate. Preferably, semiconductor substrate 28 has a principal surface 58 previously processed and cleaned to remove debris and native oxides.

STI region 30 is formed by etching a narrow trench into the semiconductor substrate 28. The narrow trench has a thickness of between about 2000 angstroms and about 4000 angstroms. Upon etching the narrow trench, the narrow trench is then filled with a dielectric material. In one preferred embodiment, STI region 30 includes at least one dielectric material known by those skilled in the art, such as, a conventional oxide, a nitride, an oxynitride, and any other dielectric, such as borophosphosilicate glass (BPSG), borosilicate glass (BSG), phosphosilicate glass, spin-on glass (SOG), silicon oxide, P-doped silicon oxide (P-glass), silicon nitride, for example $SiO_2$, $Si_3N_4$, $Al_2O_3$, $SiO_xN_y$, etc., and polysilicon. Preferably, at least one STI region 30 is formed in the core region 24 of semiconductor substrate 28 and at least one STI region 30 is formed in the peripheral gate region 26 of semiconductor substrate 28.

Figure 3:
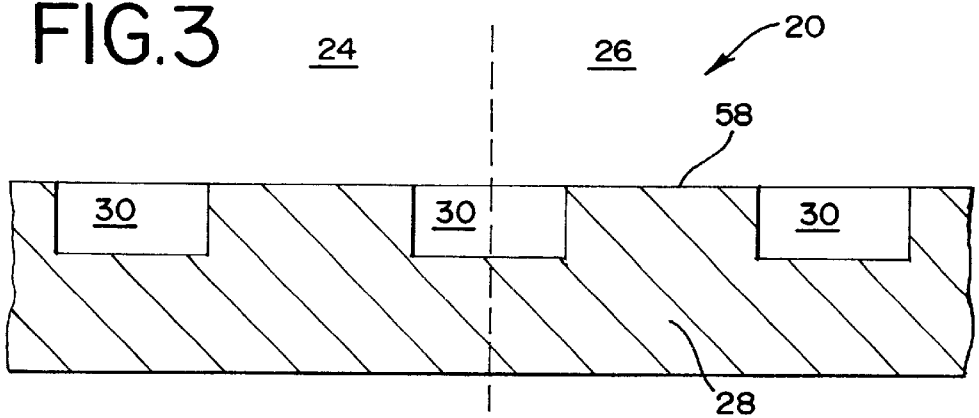

In one embodiment, upon forming STI region 30, a sacrificial oxide layer 32 is formed overlying the semiconductor substrate 28, as illustrated in FIG. 2. Preferably, the sacrificial oxide layer 32 is grown over semiconductor substrate 28, and more preferably, sacrificial oxide layer 32 has a thickness of about 50 angstroms to about 200 angstroms and, more preferably, a thickness of about 100 angstroms. Upon growing sacrificial oxide layer 32, sacrificial oxide layer 32 is removed, preferably by performing a hydrofluoric acid etch, in order to process and clean the principal surface 58 of semiconductor substrate 28, as illustrated in FIG. 3.

Upon forming STI region 30, a tunnel oxide layer 34 is formed overlying the semiconductor substrate 28, as illustrated in FIG. 4. Preferably, the tunnel oxide layer 34 is grown over semiconductor substrate 28, and more preferably, the tunnel oxide layer 34 has a thickness of about 90 to about 120 angstroms and, more preferably, a thickness of about 110 angstroms. Tunnel oxide layer 34 comprises an oxide and a nitride. Preferably, tunnel oxide layer 34 is formed using an oxynitridation process, and more specifically by growing a first layer made of $SiO_2$ at a temperature of between about 900° C. and 1200° C., and more preferably a temperature of about 1050° C. The first layer has a thickness ranging from between about 60 angstroms to about 90 angstroms. Upon growing the first layer, the first layer is then annealed into an $N_2O$ ambient to a final thickness of between about 90 angstroms to about 120 angstroms.

Upon forming tunnel oxide layer 34, nitrogen from within the tunnel oxide layer 34 begins to react materials within the semiconductor substrate 28, and forms nitrogen-contaminated regions 36 within the semiconductor substrate 28, as illustrated in FIG. 4. In one embodiment, nitrogen-contaminated regions 36 are formed in the core region 24 and in the peripheral gate region 26 of the semiconductor substrate 28, as illustrated in FIG. 4. In one embodiment, nitrogen-contaminated regions 36 are formed in the peripheral gate region 26 of the semiconductor substrate 28. Preferably, nitrogen-contaminated regions 36 are not formed in the STI region 30 within the semiconductor substrate 28.

Upon forming tunnel oxide layer 34, a first polysilicon layer 38 is deposited overlying semiconductor substrate 28, and more preferably, overlying the tunnel oxide layer 34, as illustrated in FIG. 5. Preferably, first polysilicon layer 38 has a thickness of about 700 angstroms to about 1000 angstroms and, more preferably, a thickness of about 900 angstroms. First polysilicon layer comprises any polysilicon known by those skilled in the art. Upon depositing first polysilicon layer 38, first polysilicon layer 38 is patterned. First polysilicon layer 38 is patterned in one of many ways known to those skilled in the art. In one embodiment, a mask, such as a photoresist mask, is deposited above first polysilicon layer 38, whereupon the mask is used to pattern first polysilicon layer 38.

Upon patterning first polysilicon layer 38, ONO layer 40 is formed overlying the semiconductor substrate, and more preferably, overlying the first polysilicon layer 38, as illustrated in FIG. 5. ONO layer 40 includes a first oxide layer 48, a nitride layer 50, and a second oxide layer 52. Preferably, first oxide layer 48 has a thickness of about 20 to about 60 angstroms and, more preferably, a thickness of about 40 angstroms. First oxide layer 48 and second oxide layer 52 include any metal oxide conventionally used to isolate electrically active structures in an integrated circuit from each other, typically an oxide of silicon and/or aluminum (e.g., $SiO_2$ or $Al_2O_3$, which may be conventionally doped with fluorine, boron, phosphorus or a mixture thereof; preferably $SiO_2$ or $SiO_2$ conventionally doped with 1–12 wt % of phosphorous and 0–8 wt % of boron). Preferably, first oxide layer 48 and second oxide layer 52 include silicon dioxide.

After forming first oxide layer 48, nitride layer 50 is deposited overlying first oxide layer 48, as illustrated in FIG. 5. Preferably, nitride layer 50 is deposited overlying first oxide layer 48 having an initial thickness of about 60 angstroms to about 95 angstroms and, more preferably, an initial thickness of about 85 angstroms. Preferably, nitride layer 50 includes silicon nitride. More preferably, nitride layer 50 is formed by reacting ammonia $NH_3$ with either dichlorosilane ($SiCl_2H_2$) or silane ($SiH_4$). After depositing nitride layer 50, second oxide layer 52 is formed overlying nitride layer 50, as illustrated in FIG. 5. Preferably, second oxide layer 52 has a thickness of about 20 to about 40 angstroms and, more preferably, a thickness of about 30 angstroms.

Once ONO layer 40 has been formed, ONO layer 40 and first polysilicon layer 38 are removed from the peripheral gate region 26 so as to expose a portion of the tunnel oxide layer 34 in the peripheral gate region 26, as illustrated in FIG. 6. Preferably, ONO layer 40 and first polysilicon layer 38 are etched from the peripheral gate region 26. In one embodiment, a photoresist layer is deposited overlying ONO layer 40. The photoresist layer comprises any photoresist known by those skilled in the art. Preferably, the photoresist layer has a thickness of about 4,000 to about 10,000 angstroms and, more preferably, a thickness of about 5,000 to about 6,000 angstroms. After the photoresist layer has been deposited, the photoresist layer is patterned into photoresist mask 54, as illustrated in FIG. 6. Preferably, the photoresist layer is exposed to a light source, such as an ultra-violet light source, which allows for the patterning of the photoresist layer into the photoresist mask 54. Photoresist mask 54 is formed overlying the ONO layer 40 in the core region 24. Upon forming photoresist mask 54, an etch is applied to the semiconductor substrate 28 to remove at least a portion of the ONO layer 40 and the first polysilicon layer 38 in the peripheral gate region 26 of the semiconductor substrate 28 so as to expose a portion of the tunnel oxide layer 34 in the peripheral gate region 26, as illustrated in FIG. 6.

Upon removing ONO layer 40 and first polysilicon layer 38 from the peripheral gate region 26, the photoresist mask 54 is removed and a sacrificial oxide layer 42 is grown overlying the exposed tunnel oxide layer 34 in the peripheral gate region 26, as illustrated in FIG. 7. Preferably, the sacrificial oxide layer 42 has a thickness of about 50 to about 200 angstroms and, more preferably, a thickness of about 100 angstroms. Sacrificial oxide layer 42 is grown by a wet or dry $O_2$ process at a temperature of between about 800° C. and 1100° C. and more preferably at a temperature of between about 900° C. and 1050° C. Upon growing the sacrificial oxide layer 42, oxygen from within the sacrificial oxide layer 42 diffuses into the nitrogen-contaminated region 36 and reacts with silicon in the nitrogen-contaminated region 36 to form silicon dioxide. As a result, nitrogen-contaminated-region 36 is eventually transformed into a silicon oxide region 60 having nitrogen 56 surrounded by silicon dioxide, as illustrated in FIG. 8. Having the nitrogen 56 surrounded by silicon dioxide allows for the removal of the nitrogen 56 from the peripheral gate region 26 of the semiconductor substrate 28 by simply removing the silicon oxide region 60 using an etch, thus improving the reliability of gate oxide layer 44.

Upon growing sacrificial oxide layer 42, sacrificial oxide layer 42 in the peripheral gate region 26, tunnel oxide layer 34 in the peripheral gate region 26, and at least a portion of silicon oxide region 60 are removed, as illustrated in FIG. 9. Preferably, to protect ONO layer 40, and in particular, to protect second oxide layer 52, a photoresist mask 54 is deposited overlying the second oxide layer 52 in the core region 24. The photoresist mask 54 comprises any photoresist known by those skilled in the art. Preferably, the photoresist mask 54 has a thickness of about 4,000 to about 10,000 angstroms and, more preferably, a thickness of about 5,000 to about 6,000 angstroms. Upon forming photoresist mask 54, an etch is applied to the semiconductor substrate 28 to remove the sacrificial oxide layer 42, the tunnel oxide layer 34 in the peripheral gate region 26, and at least a portion of silicon oxide region 60. Preferably, a portion of the semiconductor substrate 28 in the peripheral gate region 26 is exposed upon removing the sacrificial oxide layer 42, the tunnel oxide layer 34 in the peripheral gate region 26, and at least a portion of silicon oxide region 60, as illustrated in FIG. 9.

Upon removing the sacrificial oxide layer 42, the tunnel oxide layer 34 in the peripheral gate region 26, and at least a portion of silicon oxide region 60, a gate oxide layer 44 is grown overlying the semiconductor substrate 28 in the peripheral gate region 26, as illustrated in FIG. 1. Preferably, the gate oxide layer 44 has a thickness of about 100 angstroms to about 200 angstroms and, more preferably, a thickness of about 150 angstroms. Preferably, gate oxide layer 44 is grown using a dry $O_2$ process at a temperature of about 950° C. Upon growing gate oxide layer 44, a second polysilicon layer 46 is deposited overlying the semiconductor substrate in the core region 24 and the peripheral gate region 26. Preferably, the second polysilicon layer 44 has a thickness of about 2000 to about 3000 angstroms and, more preferably, a thickness of about 2500 angstroms. Upon depositing second polysilicon layer 44, second polysilicon layer 44 is patterned. Second polysilicon layer 44 is patterned in one of many ways known to those skilled in the art. In one embodiment, a mask, such as a photoresist mask, is deposited above second polysilicon layer 44, whereupon the mask is used to pattern second polysilicon layer 44.

Thus, there has been disclosed in accordance with the invention, a process for fabricating a semiconductor device that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications that fall within the scope of the appended claims and equivalents thereof.

What is claimed is:

1. A process for fabricating a semiconductor device comprising:
   providing a semiconductor substrate having a core region and a peripheral gate region, at least one shallow trench isolation region in the semiconductor substrate, at least one nitrogen-contaminated region in the peripheral gate region of the semiconductor substrate, a tunnel oxide layer overlying the semiconductor substrate, a first polysilicon layer overlying the tunnel oxide in the core region, and an ONO layer overlying the first polysilicon layer in the core region;
   growing a sacrificial oxide layer overlying the nitrogen-contaminated region in the peripheral gate region, the sacrificial oxide layer being formed immediately on top of the tunnel oxide layer, wherein oxygen from within the sacrificial oxide layer diffuses into the nitrogen-contaminated region to form a silicon dioxide region;
   depositing a photoresist over the core region for protection from a subsequent etch process;
   subsequently removing the sacrificial oxide layer, the tunnel oxide layer and the silicon dioxide region in the peripheral gate region; and
   forming a gate oxide layer over the semiconductor substrate in the peripheral region and shallow trench isolation region using a dry oxidation process at a temperature of about 950° C.

2. The process of claim 1, wherein the sacrificial oxide layer is removed using hydrofluoric acid.

3. The process of claim 1, further comprising:
   forming a second polysilicon layer overlying the semiconductor substrate in the core region and the peripheral gate region.

4. The process of claim 1, wherein the sacrificial oxide layer is removed using a hydrofluoric acid solution.

5. A process for fabricating a memory cell comprising:
   providing a semiconductor substrate having a core region and a peripheral gate region and at least one shallow trench region in the semiconductor substrate;
   growing a tunnel oxide layer overlying the semiconductor substrate, wherein the growing of the tunnel oxide layer forms at least one nitrogen-contaminated region in the semiconductor substrate;
   forming a first polysilicon layer overlying the tunnel oxide layer in the core region;
   depositing an ONO layer overlying the first polysilicon layer in the core region;
   growing a first sacrificial oxide layer overlying the nitrogen-contaminated region in the peripheral gate region, the sacrificial oxide layer being formed immediately on top of the tunnel oxide layer, wherein oxygen from within the first sacrificial oxide layer diffuses into the nitrogen-contaminated region to form at least one silicon dioxide region;
   subsequently removing the sacrificial oxide layer, the tunnel oxide layer and the silicon dioxide region in the peripheral gate region; and
   forming a gate oxide layer over the semiconductor substrate in the peripheral region and shallow trench isolation region using a dry oxidation process at a temperature of about 950° C.

6. The process of claim 5, further comprising:
   forming a second polysilicon layer overlying the semiconductor substrate in the core region and the peripheral gate region.

7. The process of claim 5, wherein the sacrificial oxide layer is removed using a hydrofluoric acid dip.

8. The process of claim 5, wherein the growing of the tunnel oxide layer comprises using an oxynitridation process.

9. The process of claim 5, further comprising:
   growing a second sacrificial oxide layer overlying the semiconductor substrate in the core region and the peripheral gate region; and
   removing the second sacrificial oxide layer before the growing of the tunnel oxide layer.

10. The process of claim 5, wherein the ONO layer has a first oxide layer overlying the semiconductor substrate, a nitride layer overlying the first oxide layer, and a second oxide layer overlying the nitride layer.

11. A process for fabricating a semiconductor device comprising:
    providing a semiconductor substrate having at least one nitrogen-contaminated region in the semiconductor substrate, and a tunnel oxide layer overlying the semiconductor substrate;
    growing a sacrificial oxide layer overlying the nitrogen-contaminated region in the peripheral gate region, the sacrificial oxide layer being formed immediately on top of the tunnel oxide layer, wherein oxygen from within the sacrificial oxide layer diffuses into the nitrogen-contaminated region to form a silicon dioxide region;
    depositing a photoresist over the core region for protection from a subsequent etch process;
    subsequently, removing the sacrificial oxide layer, the tunnel oxide layer and the silicon dioxide region in the peripheral gate region; and
    forming a gate oxide layer over the semiconductor substrate in the peripheral region and shallow trench isolation region using a dry oxidation process at a temperature of about 950° C.

12. The process of claim 11, wherein the sacrificial oxide layer is removed using a hydrofluoric acid.

13. The process of claim 11, further comprising:

forming a second polysilicon layer overlying the semiconductor substrate in the core region and the peripheral gate region.

14. The process of claim 11, wherein the tunnel oxide layer is formed using an oxynitridation process.

15. The process of claim 11, further comprising:

forming a first polysilicon layer overlying the tunnel oxide layer;

depositing an ONO layer overlying the first polysilicon layer; and removing at least a portion of the ONO layer and the first polysilicon layer.

16. A process for fabricating a semiconductor device comprising:

providing a semiconductor substrate having a core region and a peripheral gate region, at least one shallow trench isolation region in the semiconductor substrate, at least one nitrogen-contaminated region in the peripheral gate region of the semiconductor substrate, a tunnel oxide layer overlying the semiconductor substrate;

growing a sacrificial oxide layer overlying the nitrogen-contaminated region in the peripheral gate region, the sacrificial oxide layer being formed immediately on top of the tunnel oxide layer, wherein oxygen from within the sacrificial oxide layer diffuses into the nitrogen-contaminated region to form a silicon dioxide region;

removing the sacrificial oxide layer, at least a portion of the tunnel oxide layer and at least a portion of the silicon dioxide region in the peripheral gate region; and forming a gate oxide layer over the semiconductor substrate in the peripheral region and shallow trench isolation region using a dry oxidation process at a temperature of about 950° C.

17. The process of claim 16, further comprising:

depositing a first polysilicon layer overlying the tunnel oxide layer in the core region; and forming an ONO layer overlying the first polysilicon layer in the core region.

* * * * *